United States Patent
Niessen et al.

(10) Patent No.: US 10,097,162 B2
(45) Date of Patent: Oct. 9, 2018

(54) WIRELESS CHARGER RECEIVER-SIDE COMMUNICATION INTERFERENCE ELIMINATION

(71) Applicant: NXP B.V., Eindhoven (NL)

(72) Inventors: Patrick Niessen, Heythusysen (NL); Rene Geraets, Eindhoven (NL)

(73) Assignee: NXP B.V., Eindhoven (NL)

( * ) Notice: Subject to any disclaimer, the term of this patent is extended or adjusted under 35 U.S.C. 154(b) by 579 days.

(21) Appl. No.: 14/308,148

(22) Filed: Jun. 18, 2014

(65) Prior Publication Data

US 2015/0372662 A1    Dec. 24, 2015

(51) Int. Cl.

| | |
|---|---|
| *H03H 11/04* | (2006.01) |
| *H02J 5/00* | (2016.01) |
| *H01F 38/14* | (2006.01) |
| *H02J 7/02* | (2016.01) |
| *H03H 7/01* | (2006.01) |
| *H02J 50/40* | (2016.01) |
| *H02J 50/70* | (2016.01) |
| *H04B 5/00* | (2006.01) |
| *H02J 50/10* | (2016.01) |
| *H02J 50/80* | (2016.01) |

(52) U.S. Cl.
CPC ............. *H03H 11/04* (2013.01); *H01F 38/14* (2013.01); *H02J 7/025* (2013.01); *H02J 50/10* (2016.02); *H02J 50/40* (2016.02); *H02J 50/70* (2016.02); *H02J 50/80* (2016.02); *H03H 7/0138* (2013.01); *H04B 5/0031* (2013.01); *H04B 5/0037* (2013.01); *H04B 5/0075* (2013.01)

(58) Field of Classification Search
CPC ....... H03H 11/04; H03H 7/0138; H02J 50/10; H02J 5/005; H02J 50/80; H02J 7/025; H04B 5/0031; H04B 5/0037; H04B 5/0075; H01F 38/14
USPC .......................................................... 307/104
See application file for complete search history.

(56) References Cited

U.S. PATENT DOCUMENTS

| | | | | |
|---|---|---|---|---|
| 4,767,998 A | * | 8/1988 | Delagrange ............ | H03H 11/04 330/107 |
| 5,325,046 A | * | 6/1994 | Young ...................... | G05F 1/32 323/356 |

(Continued)

FOREIGN PATENT DOCUMENTS

| | | |
|---|---|---|
| CN | 101743696 A | 6/2010 |
| CN | 103460615 A | 12/2013 |

(Continued)

OTHER PUBLICATIONS

Extended European Search Report for Patent Appln. No. 15170868.2 (dated Sep. 15, 2011).

(Continued)

*Primary Examiner* — Jared Fureman
*Assistant Examiner* — Michael Warmflash

(57) ABSTRACT

Embodiments of an apparatus are disclosed. In an embodiment, a power receiver unit is disclosed. The power receiver unit includes a power pick-up unit, a communication modulator, and a filter. The power pick-up unit receives a wireless power signal. The communication modulator applies a modulation to the received wireless power signal. The filter suppresses a load signal from a load of the wireless charge receiver to prevent interference with the modulation.

19 Claims, 8 Drawing Sheets

(56) References Cited

U.S. PATENT DOCUMENTS

| | | | |
|---|---|---|---|
| 9,065,488 B2* | 6/2015 | Kim | H04B 5/0031 |
| 9,318,897 B2* | 4/2016 | Brohlin | H02J 5/005 |
| 9,419,688 B2* | 8/2016 | Washiro | H04B 5/0081 |
| 2009/0010462 A1* | 1/2009 | Ekchian | H01M 2/1022 |
| | | | 381/312 |
| 2010/0181961 A1* | 7/2010 | Novak | H02J 7/025 |
| | | | 320/108 |
| 2011/0163608 A1* | 7/2011 | Brohlin | H02J 5/005 |
| | | | 307/104 |
| 2012/0175969 A1* | 7/2012 | Maughan | H01F 38/14 |
| | | | 307/104 |
| 2014/0008990 A1* | 1/2014 | Yoon | H02J 5/005 |
| | | | 307/104 |
| 2014/0015336 A1* | 1/2014 | Weber | H01F 38/14 |
| | | | 307/104 |
| 2014/0152251 A1* | 6/2014 | Kim | H02J 7/025 |
| | | | 320/108 |
| 2015/0244176 A1* | 8/2015 | Van Den Brink | H02J 5/005 |
| | | | 307/104 |

FOREIGN PATENT DOCUMENTS

| | | | |
|---|---|---|---|
| EP | 2662800 A1 * | 11/2013 | G06K 7/0008 |
| EP | 2662800 A1 | 11/2013 | |
| JP | WO 2013042570 A1 * | 3/2013 | H02J 5/005 |
| WO | WO-2013/042570 A1 | 3/2013 | |
| WO | 2013136686 A2 | 9/2013 | |
| WO | 2014039088 A1 | 3/2014 | |

OTHER PUBLICATIONS

"Highly Integrated Wireless Receiver Qi (WPC V1.1) Compliant Power Supply" Texas Instruments, bq51013B, (2013), 42 pages.

Fairchild Semiconductor, "AN-8023 Negative Voltage Management Using a FAN8303 Buck Regulator" originally published at www.fairchildsemi.com; Fairchild is now part of ON Semiconductor published at http://www.onsemi.com/pub/Collateral/AN-8023.pdf.pdf; Rev. 1.0.0 Jul. 30, 2009.

Shi; Zhongzhuo; "Wireless Charger Technology and Solution [including English abstract translation]," DOI: 10.3969/j.issn. 1005-5517.2013.11.011, Electronic Engineering & Product World Journal; www.eepw.com.cn Nov. 2013.

* cited by examiner

WIRELESS CHARGER RECEIVER-SIDE COMMUNICATION INTERFERENCE ELIMINATION

Demand for wireless charging is growing in the portable electronics product market. One of the emerging standards set by the Wireless Power Consortium to govern wireless charging designs for manufacturers and developers of wireless charging systems is called "Qi." The Qi low-power standard describes a differential bi-phase encoding scheme to modulate data bits onto an incoming power signal. As the power signal receiver modulates the incoming power signal from the transmitter, the load at the transmitter changes. These load changes at the transmitter can be translated into a communication. Load modulation systems may be resistive, capacitive, or inductive in nature.

In one wireless charging approach, the individual data bits of the modulation are aligned with an internal clock signal such that the beginning of each bit is aligned with the rising edge of the clock signal. According to Qi, the internal clock signal should have a frequency of 2(±4%) kHz. Using this wireless charging approach, a bit with a value of one is communicated by creating two transitions (one transition occurring during the rising edge of the clock signal and another contemporaneous with the falling edge of the clock signal). A bit with a value of zero is encoded by creating a single transition (coinciding with the rising edge of the clock signal). Standardizing this communication method allows for compatibility among a variety of systems.

However, several inefficiencies and previously undiscovered problems affect some existing systems. Some of these problems may lead a consumer or product developer to incorrectly assume that a charging unit is faulty. This can be a source of frustration for the consumer as well as the manufacturer. This may also adversely affect the manufacturer's brand image and create financial challenges for the manufacturer as a result of consumers wrongly assuming that the charger is faulty and associating that with the manufacturer.

Embodiments of an apparatus are described. In one embodiment, the apparatus is a power receiver unit. The power receiver unit includes a power pick-up unit, a communication modulator, and a filter. The power pick-up unit receives a wireless power signal. The communication modulator applies a modulation to the received wireless power signal. The filter suppresses a load signal from a load of the wireless charge receiver to prevent interference with the modulation.

A method is also described. In one embodiment, the method is a method for suppressing wireless power signal interference. The method includes receiving a wireless power signal during a power mode. The method also includes modulating the received wireless power signal during a communication stage. The communication stage occurring during the power mode. The method also includes filtering a load signal to prevent interference affecting the modulation.

A system is also described. In one embodiment, the system is a wireless power system. The system includes a power sending unit and a power receiver unit. The power sending unit transmits a wireless power signal. The power receiver unit receives the wireless power signal and modulates the received power signal to communicate with the power sending unit. The power signal receiver includes a filter to suppress a load signal to prevent interference in the modulated wireless power signal.

Other aspects in accordance with the invention will become apparent from the following detailed description, taken in conjunction with the accompanying drawings, illustrated by way of example of the principles of the invention.

Throughout the description, similar reference numbers may be used to identify similar elements.

Figure 1:
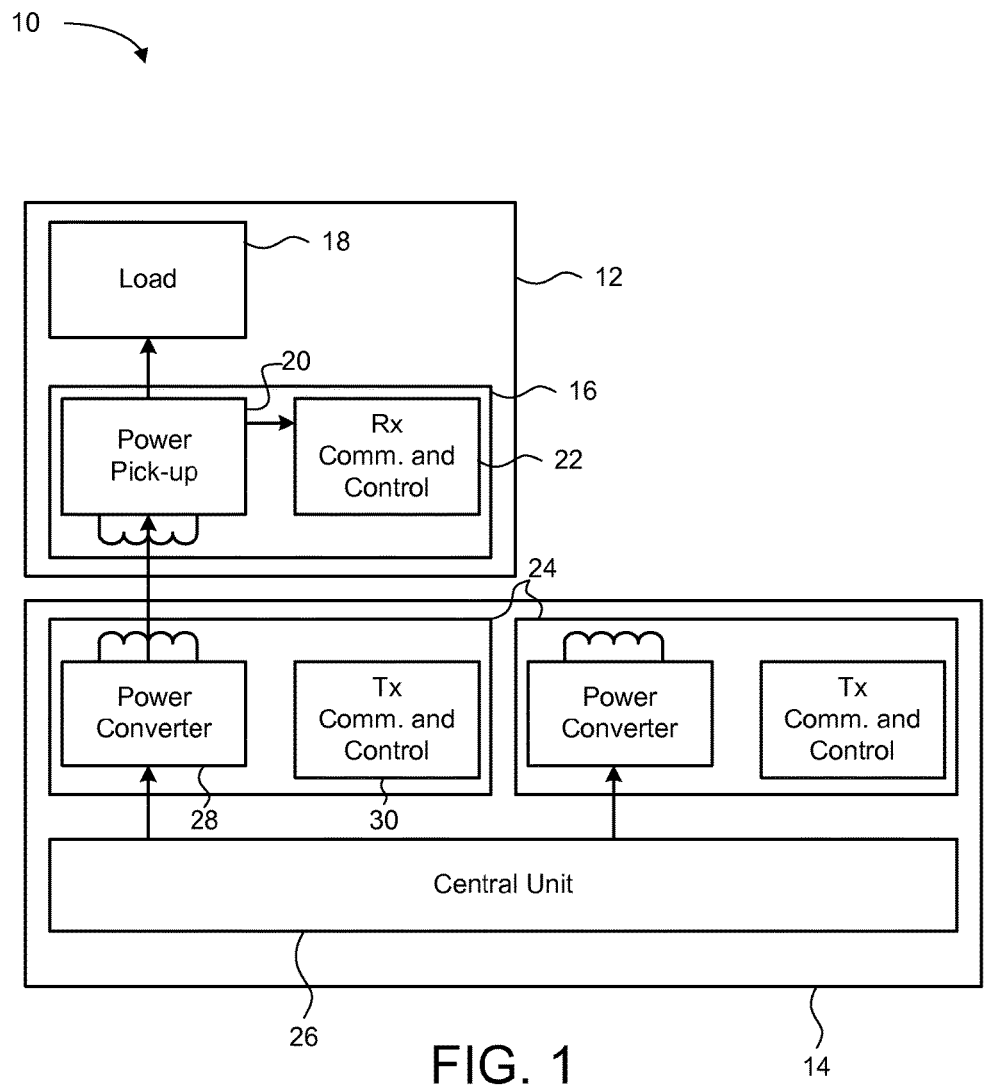
FIG. 1 depicts a schematic block diagram of one embodiment of a wireless charge system.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

In the following description and accompanying figures, a solution for issues related to wireless charging is discussed. It has been discovered that signals from a load within the frequency range in which the charging process occurs can interfere with a modulation process by which a receiver communicates with a wireless charger. In general, a receiving unit can modulate a received power signal to cause loading changes at the power sending unit. The detected load changes can be interpreted by the power sending unit to communicate information from the receiver unit to the power sending unit. For example, when wirelessly charging a phone or other mobile device at a wireless charging station, signals generated during operation of the phone itself, independent of the charging process, can interfere with modulation of the wireless charging signal. This can affect the modulation processes by which the phone communicates, for example, a charge status to the charging station. The resulting interference with the modulated signal can be enough to significantly degrade the communication between the phone and the charging station. This can cause overheating, undercharging, slow charging, or other charging issues. However, we have discovered that, if a filter is included between the modulation circuitry and the other signal generating circuitry of the phone, the interference can be suppressed to facilitate an improved charging process.

FIG. 1 depicts a schematic block diagram of one embodiment of a wireless charge system 10. The system 10 includes a receiving unit 12 and a power sending unit 14. The illustrated embodiment of the receiving unit 12 includes a power receiver 16 and a load 18. The power receiver 16 includes a power pick-up module 20 and a receiver communications and control module 22 (shown as Rx Comm. and Control).

The illustrated embodiment of the power sending unit 14 includes power transmitters 24 and a central unit 26. The power transmitters 24 each include a power converter 28 and a transmitter communications and control module 30 (shown as Tx Comm. and Control). The sending unit 14 may include one or more power transmitters 24 to facilitate power transmission to multiple receiving units 12. In one embodiment, the central unit 26 controls distribution of power to the power transmitters 24. The central unit 26 may also provide control or sensing signals to the power transmitters 24. In the illustrated embodiment, a single central unit 26 corresponds with multiple power transmitters 24. In another embodiment, a single central unit 26 corresponds with only one power transmitter 24. The central unit 26 may include a programmable memory and processor to facilitate execution of a power transmission algorithm or other program, schedule, routine, or process. The central unit 26 may manage fewer or more aspects and provide less or additional functionality for the power sending unit 14.

The power converter 28 transmits power from the power sending unit 14. In one embodiment, the power converter 28 receives a power signal from the central unit 26 and converts the power signal into a format compatible with the transmission or charging process. For example, the power converter 28 may receive a DC power signal from the central unit 26 and convert the power signal to an AC power signal for transmission. The power converter 28 may include an inductor or other means of power conversion and transmission.

The transmitter communications and control module 30 monitors the signal from the power converter 28. In one embodiment, the transmitter communications and control module 30 detects a load modulation at the power converter 28 to interpret a communication from the receiving unit 12. The transmitter communications and control module 30 may also manage an operating parameter of the power converter 28. In one embodiment, the transmitter communications and control module 30 communicates with the central unit 26 to provide information to the central unit 26. For example, the transmitter communications and control module 30 may communicate a modulation signal to the central unit 26 for processing. The transmitter communications and control module 30 may detect a presence of a receiving unit 12 at the power sending unit 14. The transmitter communications and control module 30 may provide fewer or more functions and/or advantages.

The receiving unit 12 receives a power signal from the power sending unit 14. In general, the power sending unit 14 relays a power signal to the receiving unit 12 to charge or supply power to the receiving unit 12. For example, the power sending unit 14 may be a base station, dock, or charging pad. When a receiving unit 12, such as a mobile phone, tablet, or other wireless device, is placed in the vicinity of the sending unit 14, the receiving unit 12 will gain charge or become powered. This reduces the hassle of plugging in devices with specialized cords and connectors. It also reduces the number of cords needed which reduces the danger that those cords may present when damaged or accessible to children.

During charging, the receiving unit 12 is placed in the vicinity of the sending unit 14. The power pick-up module 20 of the power receiver 16 receives a power signal from the power converter 28 of the power transmitter 24. The receiver communication and control module 22 monitors the received power signal and provides control signals to the power pick-up 20 and the load 18. The receiver communication and control module 22 may also manage modulation of the power signal to provide communication to the sending unit 14 (discussed in greater detail below).

In some embodiments, the illustrated depiction of the load 18 is a battery, circuit, or other electrical component of a device. The load 18 may be internal to the receiving unit 12 or externally connected. For example, the load 18 may be a separate battery or an integrated battery. In another example, the load 18 may be the components of a phone outside of the power receiver 16.

In some embodiments, the amount of power the load 18 draws from the power receiver 16 is not constant over time. These dynamic load variations cause interference with the modulation of the power signal by the receiver control module 22. Such interference may cause inefficiencies with the charging process or prevent the charging process from taking place altogether, as the power sending unit 14 may not be able to interpret the modulation communication provided by the receiving unit 12. Therefore, the interference must be suppressed by the power receiver 16 (discussed in more detail below).

Figure 2:
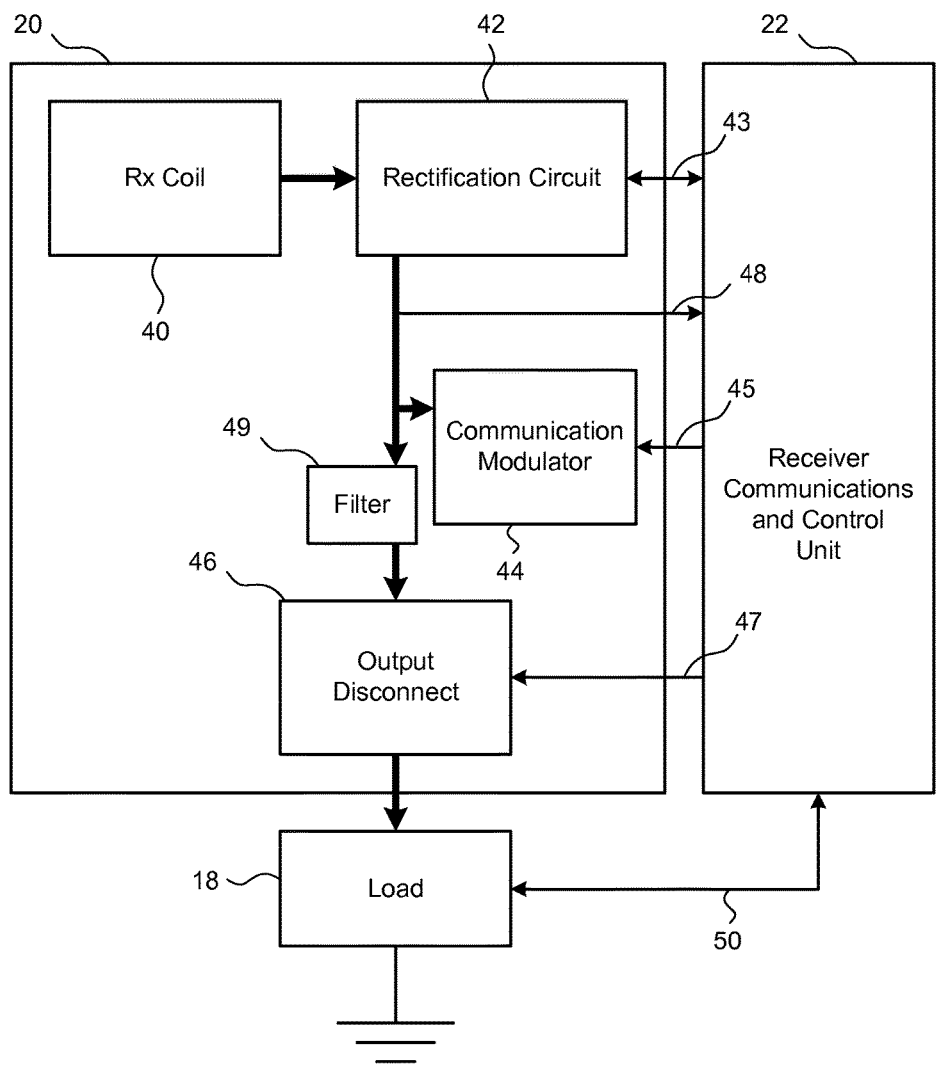
FIG. 2 depicts a functional block diagram of one embodiment of the power pick-up unit, receiver communications and control unit, and load of FIG. 1.

FIG. 2 depicts a functional block diagram of one embodiment of the power pick-up unit 20, receiver communications and control unit 22, and load 18 of FIG. 1. The illustrated embodiment of the power pick-up unit 20 includes a receiver coil (Rx Coil) 40, a rectification circuit 42, a communication modulator 44, and an output disconnect 46. The Rx coil 40 passes power to the rectification circuit 42. In one embodiment, the rectification circuit 42 converts an AC input to a DC output. The rectification circuit 42 may also include a filter to reduce the pulses in the rectified DC signal. The rectification circuit 42 passes the power signal to the communication modulator 44 and the output disconnect 46. The rectification circuit 42 is in communication 43 with the receiver communications and control unit 22. In one embodiment, the receiver communications and control unit 22 monitors and provides input to the rectification circuit 42. Additionally, the rectification circuit 42 may provide operating power to the receiver communications and control unit 22.

The communication modulator 44 receives the signal from the rectification circuit 42. The communication modulator 44 applies a modulation process to the signal which affects the electrical load on the power sending unit 14 of FIG. 1. This modulation process can be interpreted into a communication at the power sending unit 14. In some embodiments, the communication may relate to requested power level, charging level, or other system parameters or statuses. The communication modulator 44 may receive input 45 from the receiver communications and control unit 22 to manage the signal modulation process.

The output disconnect 46 also receives the power signal from the rectification circuit 42. The output disconnect 46 allows the receiver communications and control unit 22 to control the flow of the power signal from the rectification circuit 42. For example, the output disconnect 46 may be a simple electrical switch or plurality of switches to break electrical connection with the load 18 or other components or manage connectivity between components by creating connections. The output disconnect 46 may be a disconnect circuit to act as a failsafe circuit that maintains the power signal within a certain threshold so as not to damage the load 18. The output disconnect 46 may also receive input 47 from the receiver communications and control unit 22 to access a filter (described in greater detail below) or other component. In other embodiments, the output disconnect 46 may provide less or more functionality.

The illustrated embodiment of the receiver communications and control unit 22 monitors voltage in the signal sent from the rectification circuit 42. The receiver communications and control unit 22 also provides sensing and control 50 of the load 18.

In one embodiment, a filter 49 is applied to the signal prior to the output disconnect 46. The filter 49 may be an active filter or a passive filter. Additionally, the filter 49 may be located downstream from the output disconnect 46. In one embodiment, the filter 49 may be separate from the power pick-up unit 20. In some embodiments, the filter 49 may apply a filtering effect to the signal at all times. In other embodiments, the filter 49 is passive and must be activated or connected to apply a filtering effect to the signal. In some embodiments, the filter 49 is controlled, activated, and/or monitored by the receiver communications and control unit 22. Additional functionality and connectivity related to the filter 49 and the receiver communications and control unit 22 is described in more detail below.

Figure 3:
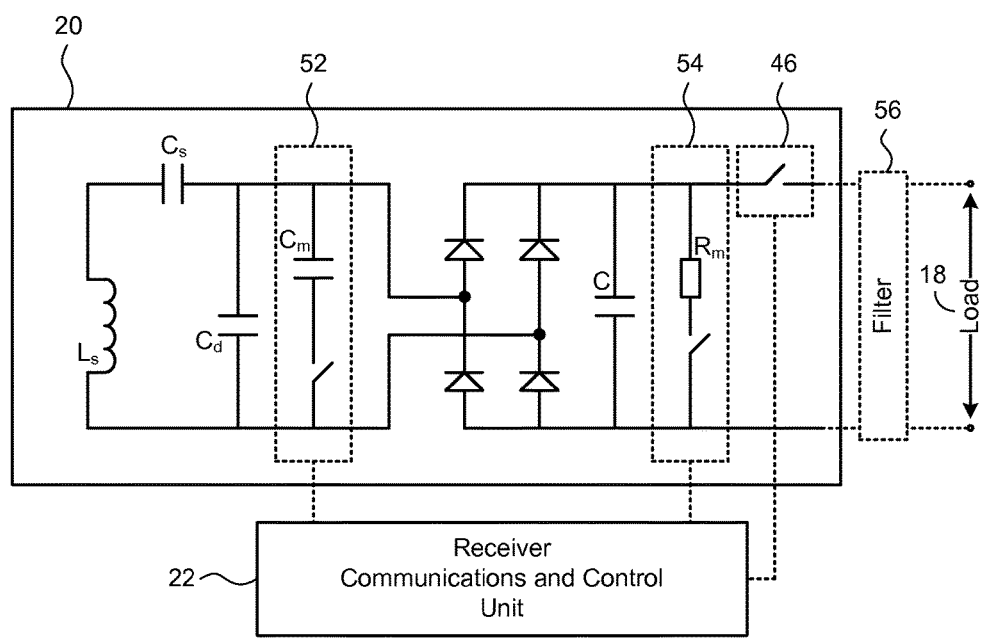
FIG. 3 depicts a schematic block diagram of one embodiment of the power pick-up unit of FIG. 1.

FIG. 3 depicts a schematic block diagram of one embodiment of the power pick-up unit 20 of FIG. 1. While the following description references specific electrical components such as capacitors, inductors, resistors, diodes, and switches in specific arrangements, it should be understood that these components and others may be arranged in a variety of arrangements to achieve similar outcomes.

The illustrated embodiment of the power pick-up unit 20 includes modulation circuits or branches 52 and 54, output disconnect 46, and the receiver communications and control unit 22. FIG. 3 also depicts a filter 56 and a load 18. The power pick-up unit 20 receives a power signal through inductor $L_s$. One embodiment of the power pick-up unit 20 includes a first modulation branch 52 (AC side). Another embodiment of the power pick-up unit 20 includes a second modulation branch 54 (DC side) instead of the first modulation branch 52. The first modulation branch 52 includes a capacitor $C_m$ and a switch. The second modulation branch 54 includes a resistor $R_m$ and a switch. The first or second modulation branch 52 or 54 applies a modulation effect to the power signal received at the inductor $L_s$. The signal is output through the output disconnect 46 to the load 18. In this embodiment, the filter unit 56 is separate from the power pick-up unit 20.

In the illustrated embodiment, each of the modulation branches 52 and 54 and the output disconnect 46 are connected to the receiver communications and control unit 22. As discussed above, the receiver communications and control unit 22 manages and provides control and input signals to these components to perform modulation, output control, and other operations.

In the illustrated embodiment, the filter 56 is located outside of the power pick-up unit 20. The filter 56 suppresses signals from the load 18 which may interfere with the modulation accomplished by the modulation branches 52 and 54. The filter 56 may be controlled and/or monitored by the receiver communications and control unit 22 or be independent of the receiver communications and control unit 22. The filter 56 may be located between the second modulation branch 54 and the output disconnect 46 or after the output disconnect 46. Other embodiments may incorporate the filter 56 in other locations relative to the power pick-up unit 20 and its components.

In one embodiment, the load 18 is a 3-5 volt load. In some embodiments, the voltage of the load 18 may be fixed. In other embodiments, the load 18 may vary dynamically. In some embodiments, the load 18 may transmit signals or harmonics into the pick-up unit 20. These load signals may interfere with the modulation operations achieved at the modulation branches 52 and 54. In some embodiments, the signals from the load are in the 1-2 kHz frequency band. These signals from the load 18 may so interfere with the modulation as to make to the modulation difficult or impossible to interpret correctly on the power sending unit 14 side.

Figure 4:
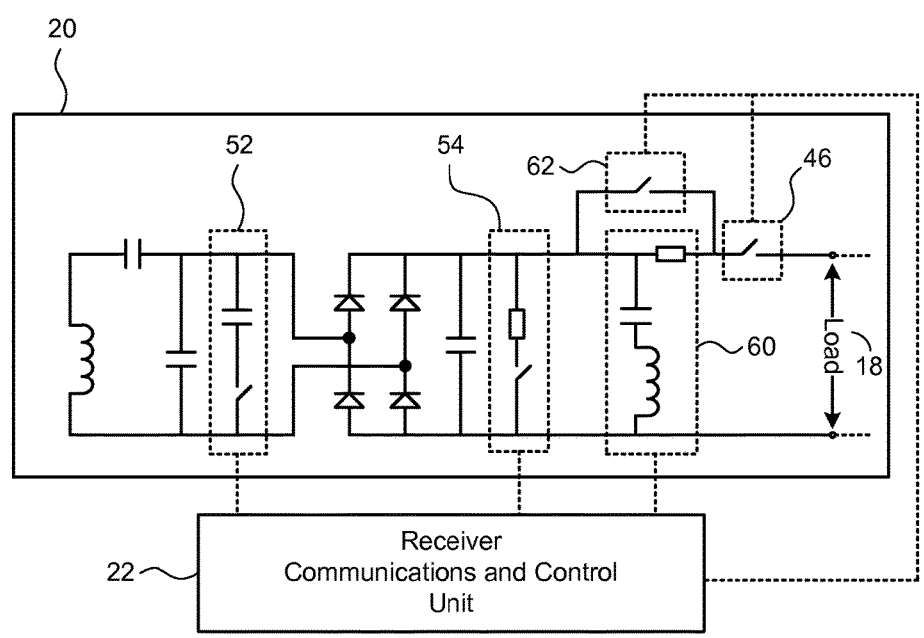
FIG. 4 depicts a schematic block diagram of one embodiment of a power pick-up unit with a passive filter.

FIG. 4 depicts a schematic block diagram of one embodiment of a power pick-up unit 20 with a passive filter 60. The illustrated embodiment shows the passive filter 60 of the power pick-up unit 20. While the illustrated embodiment of the passive filter 60 includes a resistor, a capacitor, and an inductor, other embodiments may include other components to achieve the same or similar results. The passive filter 60 removes interference coming from the load to preserve the signal modulation accomplished by the modulation branches 52 and 54. In the illustrated embodiment, the passive filter 60 may be bypassed by closing the bypass switch 62. For example, the receiver communications and control unit 22 may initiate a communication stage in which modulation is performed on the power signal. As part of the communication stage, the receiver communications and control unit 22 may open the bypass switch 62 to activate the passive filter 60. After the communication stage is completed, the receiver communications and control unit 22 may then close the bypass switch 62 to essentially deactivate the passive filter 60. This allows embodiments of the passive filter 60 to require smaller and less expensive components as lesser capacitance, inductance, and/or resistance values are needed to provide the desired effect.

In some embodiments, the receiver communications and control unit 22 may open the bypass switch 62 prior to initiating a communication stage and close the bypass switch 62 after completion of the communication stage. In another embodiment, the receiver communications and control unit 22 may initiate the communication stage and open the bypass switch 62 just prior to actual modulation of the power signal and close the bypass switch 62 just after completion of the modulation cycle to minimize the amount of time the passive filter 60 needs to operate. This would allow the passive filter 60 to incorporate smaller and less expensive components due to the reduced run time and operating burden that would be place on the passive filter 60.

In some embodiments, the passive filter 60 and the bypass switch 62 may operate in conjunction with the output disconnect 46 to provide a signal management scheme. For example, the output disconnect 46 may be opened in response to a detection of the passive filter 60 exceeding an operating parameter (e. g. number of cycles, thermal threshold, signal load, or other parameter). The output disconnect 46 may also open in response to a failure of a component of the passive filter 60 or an error regarding the bypass switch 62.

In some embodiments, the receiver communications and control unit 22 controls each of the modulation branches 52 and 54, the passive filter 60, the bypass switch 62, and the output disconnect 46. In another embodiment, one or more additional controllers may be incorporated to manage one or more of these components.

Figure 5:
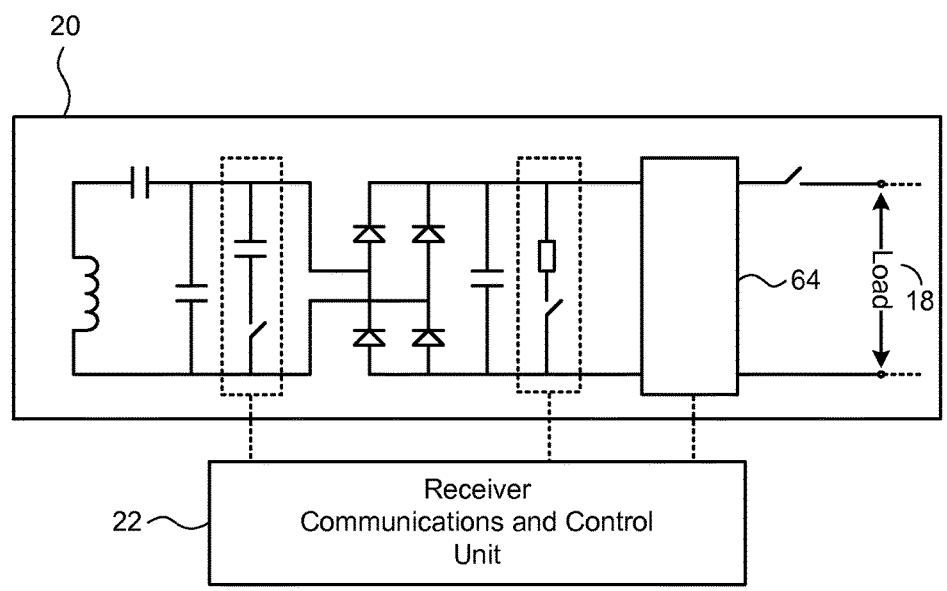
FIG. 5 depicts a schematic block diagram of one embodiment of a power pick-up unit with an active filter.

FIG. 5 depicts a schematic block diagram of one embodiment of a power pick-up unit 20 with an active filter 64. In one embodiment, the active filter 64 removes interference originating from the load 18. In another embodiment, the active filter 64 removes noise and interference from the power signal regardless of the source of the noise and interference. In some embodiments, the active filter 64 filters signals in the 1-2 kHz range. Other embodiments may filter in greater or lesser frequency ranges.

The receiver communications and control unit 22 is coupled to the active filter 64. The receiver communications and control unit 22 operates as a controller to monitor and manage the active filter 64. In some embodiments, the receiver communications and control unit 22 activates the active filter 64 during a communication stage. In another embodiment, the active filter 64 filters any power signal coming through the power pick-up unit 20. Other filtering schemes and processes may be applied.

In the illustrated embodiment, the active filter 64 is incorporated within the power pick-up unit 20. However, in some embodiments, the active filter 64 may be separate from the power pick-up unit 20. Additionally, the active filter 64 may be an arrangement of separate components or a single integrated circuit (IC) system. An IC system would benefit from reduced size and cost.

Figure 6:
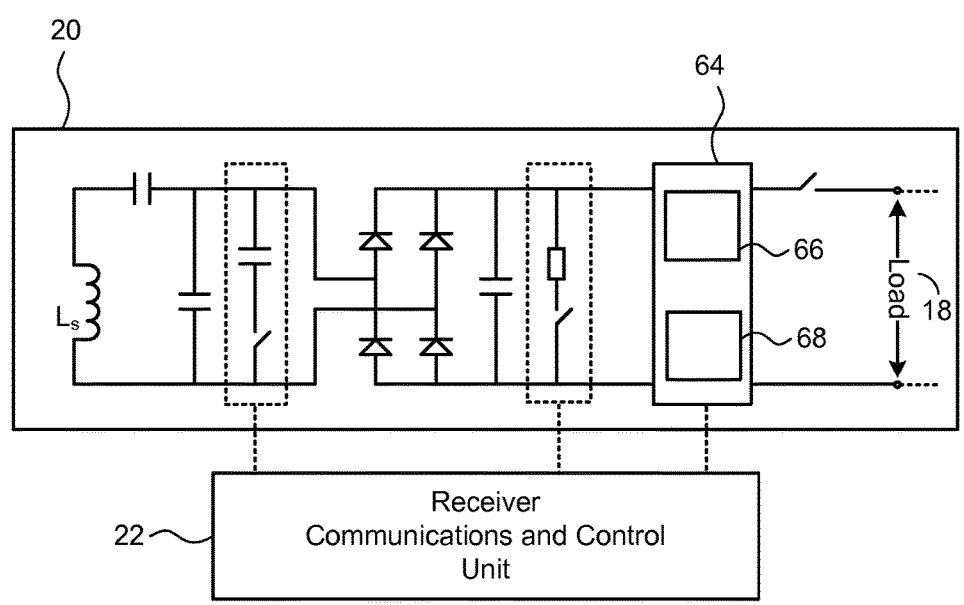
FIG. 6 depicts a schematic block diagram of another embodiment of the power pick-up unit with the active filter including a current regulator.

FIG. 6 depicts a schematic block diagram of another embodiment of the power pick-up unit 20 with the active filter 64 including a current regulator 66. In the illustrated embodiment, the active filter 64 includes the current regulator 66 and an intermediate buffer 68 (discussed in more detail relative to FIG. 7 below). The current regulator 66 stabilizes the current from the inductor $L_s$. In some embodiments, the current regulator 66 is transistor-based. In other embodiments, the current regulator 66 is a diode-based component. The current regulator 66 may include or be coupled to an intermediate buffer 68. The intermediate buffer 68 may include specific components or connections from the current regulator 66 or share some or all components with the current regulator 66.

Figure 7:
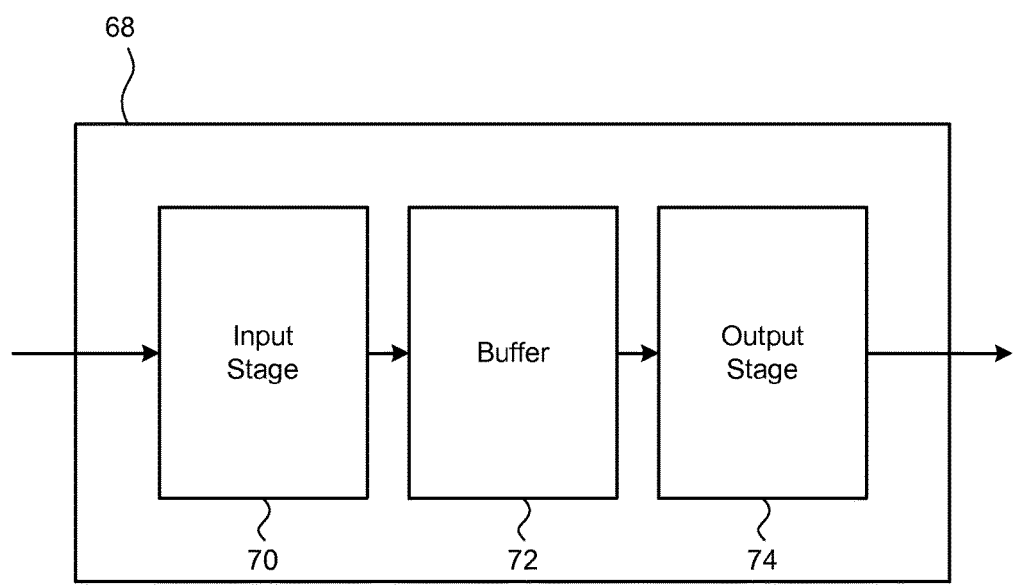
FIG. 7 depicts a schematic block diagram of one embodiment of the intermediate buffer of FIG. 5.

FIG. 7 depicts a schematic block diagram of one embodiment of the intermediate buffer 68 of FIG. 5. In the illustrated embodiment, the intermediate buffer 68 includes an input stage 70, a buffer 72, and an output stage 74. In one embodiment, the input stage 70 may include controlled current or controlled voltage source. The buffer 72 is situated between the input stage 70 and the output stage 74. The buffer 72 corresponds to the current regulator and may be a voltage buffer or a current buffer. In one embodiment, the output stage 74 includes a DC/DC converter. The output stage 74 may modify the input voltage or manage an output voltage. Other embodiments may include fewer or more components to execute fewer or more operations.

Figure 8:
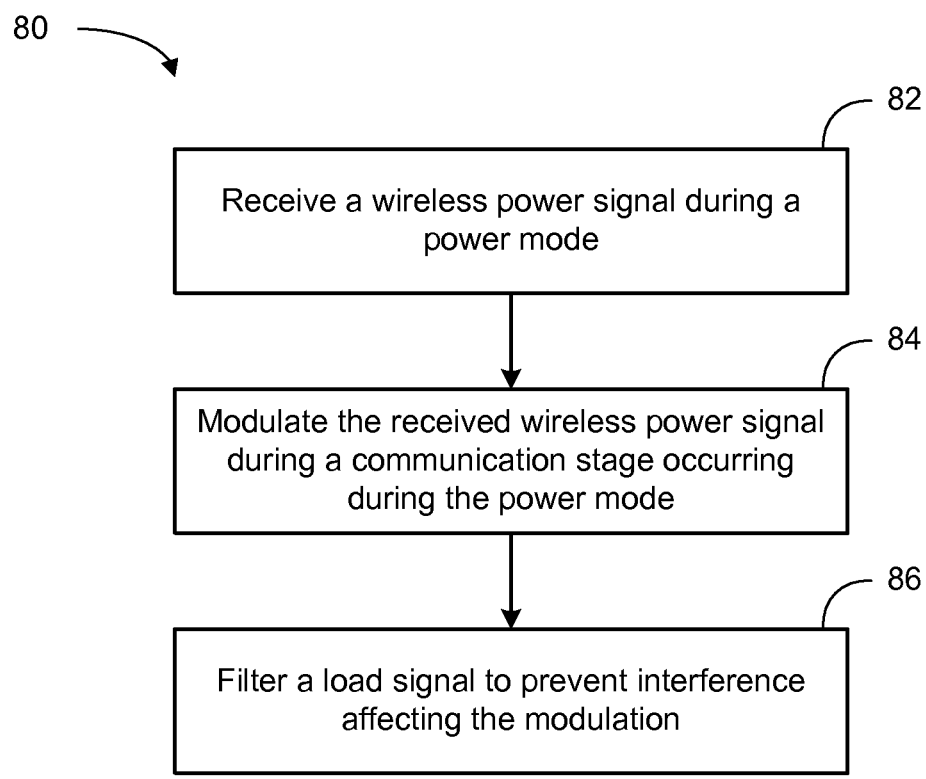
FIG. 8 depicts a flowchart diagram of one embodiment of a method for suppressing wireless power signal interference.

FIG. 8 depicts a flowchart diagram of one embodiment of a method 80 for suppressing wireless power signal interference. The method 80 includes receiving 82 a wireless power signal during a power mode. The method 80 also includes modulating 84 the received wireless power signal during a communication stage occurring during the power mode. The method 80 also includes filtering 86 a load signal to prevent interference affecting the modulation.

In some embodiments, the method 80 may include additional stages or steps to facilitate different filtering schemes and components. For example, the method 80 may include initiating a power mode, receiving power, initiating a communication mode during a power mode, initiating a filter process, sending a communication, terminating a filter process, terminating a communication mode, and terminating a power mode. Other embodiments may include other aspects, stages, or steps to achieve other functionality or results.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A wireless power receiver unit comprising:
   a power pick-up unit configured to receive a wireless power signal;
   a communication modulator to apply a modulation to the received wireless power signal; and
   a filter configured to suppress a load signal in the 1 to 2 kHz frequency band from a load of the wireless power receiver unit to prevent interference with the modulation.

2. The wireless power receiver unit of claim 1, wherein the filter is an active filter configured to constantly suppress the interference from the load.

3. The wireless power receiver unit of claim 2, wherein the active filter comprises a current regulator.

4. The wireless power receiver unit of claim 3, wherein the current regulator comprises an intermediate buffer.

5. The wireless power receiver unit of claim 4, wherein the intermediate buffer comprises:
   an input stage;
   a buffer capacitor; and
   an output stage comprising a DC/DC converter.

6. The wireless power receiver unit of claim 5, wherein the input stage comprises a controlled current source or a controlled voltage source.

7. The wireless power receiver unit of claim 1, wherein the filter is a passive filter configured to suppress the interference during a communication stage.

8. The wireless power receiver unit of claim 7, wherein the passive filter comprises one of a list of components, the list comprising:
   a capacitor;
   a resistor; and
   an inductor.

9. The wireless power receiver unit of claim 7, wherein the passive filter comprises a bypass switch to bypass the passive filter outside of the communication stage.

10. The wireless power receiver unit of claim 1, wherein the filter is coupled to a controller to manage the operation of the filter.

11. The wireless power receiver unit of claim 1, further comprising at least one modulation component configured to generate a communication by signal modulation.

12. A method for suppressing wireless power signal interference, the method comprising:
    receiving a wireless power signal during a power mode;
    modulating the received wireless power signal during a communication stage, wherein the communication stage occurs during the power mode; and
    filtering a load signal in the 1 to 2 kHz frequency band to prevent interference affecting the modulation.

13. The method of claim 12, further comprising initiating a passive filter in response to detection of initiation of the communication stage.

14. The method of claim 13, further comprising bypassing the passive filter in response to detection of completion of the communication stage.

15. The method of claim 12, wherein filtering the load signal comprises actively filtering the load signal.

16. The method of claim 15, further comprising actively filtering the load signal in response to an input from a controller.

17. A wireless power system comprising:
    a power sending unit configured to transmit a wireless power signal; and
    a power receiver unit configured to receive the wireless power signal and modulate the received power signal to communicate with the power sending unit, wherein the power receiver unit comprises:
    a filter configured to suppress a load signal in the 1 to 2 kHz frequency band to prevent interference in the modulated wireless power signal;
    a communication modulator to apply a modulation to the received wireless power signal; and
    a receiver communications and control unit configured to send input to the communication modulator to manage the signal modulation process.

18. The system of claim 17, wherein the filter is an active filter configured to constantly suppress the load signal to prevent interference affecting the modulated wireless power signal.

19. The system of claim 17, wherein the filter is a passive filter configured to suppress the load signal during a communication stage, wherein the communication stage is a period of time in which the power signal receiver modulates the wireless power signal.

* * * * *